United States Patent [19]
Craft

[11] Patent Number: 4,994,761
[45] Date of Patent: Feb. 19, 1991

[54] VHF POWER AMPLIFIER

[75] Inventor: Scott Craft, Phoenix, Ariz.

[73] Assignee: Motorola Inc., Schaumburg, Ill.

[21] Appl. No.: 431,801

[22] Filed: Nov. 6, 1989

[51] Int. Cl.$^5$ ............................................. H03F 3/191
[52] U.S. Cl. ..................... 330/302; 330/166; 330/306
[58] Field of Search ................. 330/107, 149, , 165, 330/166, 167, 171, 257 P, 298, 302, 306, 311

[56] References Cited

U.S. PATENT DOCUMENTS

| | | | |
|---|---|---|---|
| 3,386,045 | 5/1968 | Crothers | 330/171 X |
| 3,927,380 | 12/1975 | Zaleski | 330/165 X |
| 4,879,525 | 11/1989 | Larkin | 330/302 X |
| 4,890,069 | 12/1989 | Duffalo et al. | 330/302 X |

Primary Examiner—Steven Mottola
Attorney, Agent, or Firm—Raymond J. Warren; Robert M. Handy

[57] ABSTRACT

A two-stage, interstage transformer-coupled amplifier is provided with a degeneration resistor coupled between the collector of the first stage transistor and the power supply to limit the power dissipated in the first stage transistor. The first and second stages are coupled to ground through capacitor/inductor circuits to eliminate signal noise in the supply voltage. The output is filtered to remove harmonics and provide output impedance matching.

20 Claims, 3 Drawing Sheets

VHF POWER AMPLIFIER

RELATED INVENTIONS

The present invention is related to the following inventions, all assigned to the assignee of the present invention:

Thermal Shunt for Electronic Circuits, invented by Scott Craft, having Ser. No. 07/334,409, and filed on Apr. 7, 1989; and now U.S. Pat. No. 4,941,067.

Hybrid Amplifier, invented by Craft et al., having Ser. No. 07/380,230, and filed on July 14, 1989; and now U.S. Pat. No. 4,965,526.

An Electronic Assembly having Enhanced Heat Dissipating Capabilities, invented by Scott Craft, having Ser. No. 431,422, and filed on Nov. 3, 1989.

1. Field of the Invention

The present invention relates, in general, to power amplifiers and, more particularly, to very high frequency power amplifiers.

2. Background of the Invention

There is a continuing need in the industry to provide amplifiers for use in very high frequency devices which provide high gain from a low power input. It is also desirable that such devices provide harmonic rejection and meet minimum efficiency requirements. Such devices find use, for example, in sonobuoys. Sonobuoys are electronic devices which may be used: as emergency signals by boats at sea; for detecting and tracking submarines; or other similar functions.

Accordingly, it is an object of the present invention to provide a VHF power amplifier which overcomes the above deficiencies and provides the desired advantages.

A further object of the present invention is to provide a VHF power amplifier which reduces the power to be dissipated in a stage of the amplifier.

Another object of the present invention is to provide a VHF power amplifier which is economical to produce.

Still another object of the present invention is to provide a VHF power amplifier which has harmonic rejection, preferably in excess of −35 db.

Yet another object of the present invention is to provide a VHF power amplifier which has efficiencies in excess of 40%.

Another object of the present invention is to provide a VHF power amplifier which does not require mechanical tuning.

Still another object of the present invention is to provide a VHF power amplifier which permits the output signal level to be controlled by controlling a first stage DC bias.

Yet another object of the present invention is to provide a VHF power amplifier which provides a minimum output of 1 Watt when provided with an input of 4 milliwatts.

These and other objects and advantages are achieved in accordance with a preferred embodiment of the invention described below.

SUMMARY OF THE INVENTION

A particular embodiment of the present invention consists of a VHF power amplifier consisting essentially of a two stage, interstage transformer-coupled amplifier. The first stage DC bias is provided through a degeneration resistor coupled to the collector of the first stage through the primary winding of the interstage transformer. The supply voltage to the first and second stages is also decoupled to ground through capacitor/inductor circuits to eliminate unwanted signals and noise present in the supply voltage. The output is then filtered through a two stage filter device consisting of a band stop stage and a low pass stage.

DETAILED DESCRIPTION OF THE DRAWINGS

Figure 1:
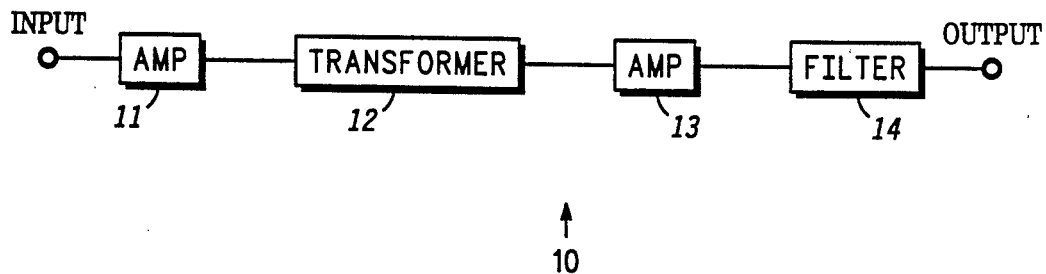
FIG. 1 is a block diagram of a circuit embodying the present invention.

Referring initially to FIG. 1, a block diagram, generally designated 10, embodying the present invention is illustrated. This basic circuit consists of a first amplifier 11 which receives and amplifies an input signal. The output from amplifier 11 is then passed on to a second amplifier 13 through a transformer 12. Transformer 12 acts to provide impedance matching between amplifiers 11 and 13 as well as signal coupling.

The output of amplifier 13 is passed through filter 14 before leaving the circuit. Filter 14 provides impedance matching between amplifier 13 and the device to which amplifier 10 will be coupled; and further provides removal of harmonics which develop in the circuit.

Figure 2:
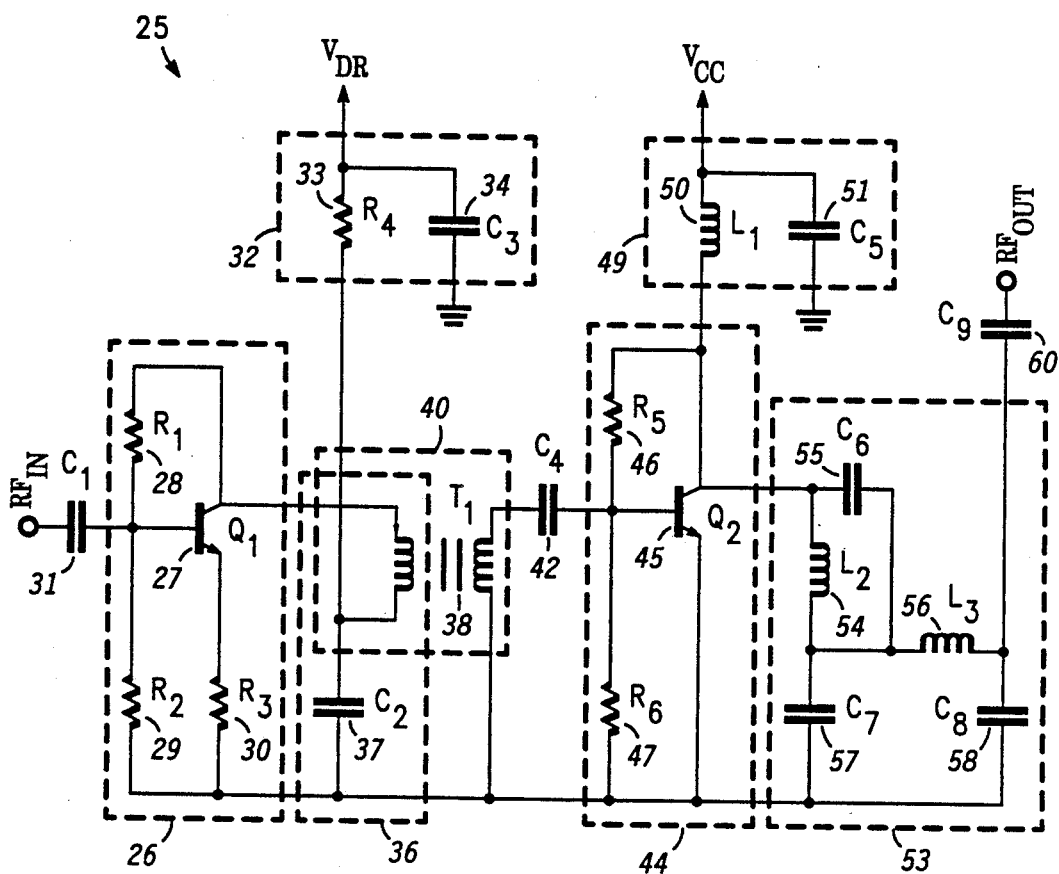
FIG. 2 is a circuit diagram of a circuit embodying the present invention.

Referring now to FIG. 2, a more detailed circuit diagram, generally designated 25, of an amplifier embodying the present invention is illustrated. Circuit 25 consists of a first amplifying stage 26. Stage 26 consists of a transistor ($Q_1$) 27 coupled in common emitter configuration and operating in class A mode. An example of transistor 27 is an SRF5406 manufactured by Motorola ® Inc.

A resistor ($R_1$) 28 is coupled between the collector and base of transistor 27. A pair of resistors 29 and 30 ($R_2$ and $R_3$) are coupled between a ground and the base and emitter, respectively, of transistor 27. Resistors 28–30 are used to bias transistor 27 to operate in a class A mode (e.g. always "on"); and to control the gain of the first stage and the impedance presented to the RF input port.

The input signal is coupled to the base of transistor 27 through a capacitor ($C_1$) 31. Capacitor 31 serves to provide RF coupling and DC blocking of the input signal.

The collector of transistor 27 is coupled to a degeneration circuit 32. Degeneration circuit 32 consists of a resistor ($R_4$) 33 and a capacitor ($C_3$) 34. Resistor 33 is coupled between a driver voltage ($V_{DR}$) and the collector of transistor 27. As will be illustrated below, the drive voltage is provided to permit tuning of stage 26. If there is no need to tune circuit 25, then the drive voltage may be the supply voltage ($V_{CC}$). Capacitor 34 is coupled between the drive voltage and ground.

Degeneration circuit 32 is provided to limit the power dissipation in transistor 27. Without degeneration circuit 32, the power dissipated in transistor 27 would result in heat problems that may damage the transistor. The degeneration circuit is provided on the collector side transistor 27 to avoid problems in impedance matching which would result if coupled on the emitter side.

By varying the voltage $V_{DR}$, the gain of transistor 27 may be varied. In changing the voltage $V_{DR}$, the emitter current is varied which in turn effects the collector current. The relation of the emitter current to the voltage $V_{DR}$ is provided in equation (1) below:

$$I_E = \frac{R_2^{2*}(b+1)^*V_{DR} - R_2^*(b+1)^*V_{BE}^*(R_4 + R_1 + R_2)}{R_2^*(b+1)^*R_3^*(R_2 + R_1 + R_4) + R_2^{2*}(R_1 + R_4 + (b^*R_4))} \quad (1)$$

The collector current is then related to the emitter current by equation (2):

$$I_c = \frac{b^*I_E}{(b+1)} \quad (2)$$

As indicated above, if there is no need to tune the amplifier, the voltage $V_{DR}$ may be coupled directly to the supply voltage ($V_{CC}$).

Circuit 25 also contains a first decoupling circuit 36. In this particular embodiment, decoupling circuit 36 consists of a capacitor 37 and an inductor provided by half of a transformer 38. Decoupling circuit 36 is provided to remove any signal or noise components from the voltage $V_{DR}$.

The output of stage 26 is input to a coupling circuit 40, here transformer 38. Transformer 38 was selected as the coupling circuit in order to provide impedance matching between stage 26 and a second stage 44. Other types of coupling between stages may be used in place of transformer 38 including direct coupling, R-C coupling, etc.

The output of coupling circuit 40 is coupled to the input of stage 44 through a capacitor ($C_4$) 42. Capacitor 42 provides RF coupling and DC blocking of the input signal, much the same as capacitor 31 does for stage 26.

Stage 44 consists of a transistor ($Q_2$) 45 in common emitter configuration and biasing resistors ($R_5$ and $R_6$) 46 and 47. An example of transistor 27 is a $SRF_{5401}$ manufactured by Motorola ® Inc. Resistors 46 and 47 are used to bias transistor 27 to operate in a class C mode (e.g. no bias base current). Resistor 46 also provides feedback between the collector and base providing improvement in the stability margin of stage 44.

A second decoupling circuit 49 consisting of an inductor ($L_1$) 50 coupled between supply voltage ($V_{CC}$) and the collector of transistor 45 and a capacitor ($C_5$) coupled between the supply voltage and ground. Decoupling circuit 49 is provided to remove any signal and noise from the supply voltage $V_{CC}$.

A filter 53 is coupled to the output of stage 44. Filter 53 is provided to remove harmonics from the output signal and to provide impedance matching. In the present embodiment, filter 53 consists of a band stop filter and a low pass filter. The band stop filter is principally comprised of an inductor ($L_2$) 54 and capacitor ($C_6$) 55. In the present embodiment, the band stop operates at 270 mhz. The low pass filter is comprised of an inductor ($L_3$) 56 and a pair of capacitors ($C_7$ and $C_8$) 57 and 58.

The output of filter 53 is then coupled to the output of circuit 25 through a capacitor ($C_9$) 60. Capacitor 60 provides RF coupling and DC blocking of the output signal.

Figure 3:
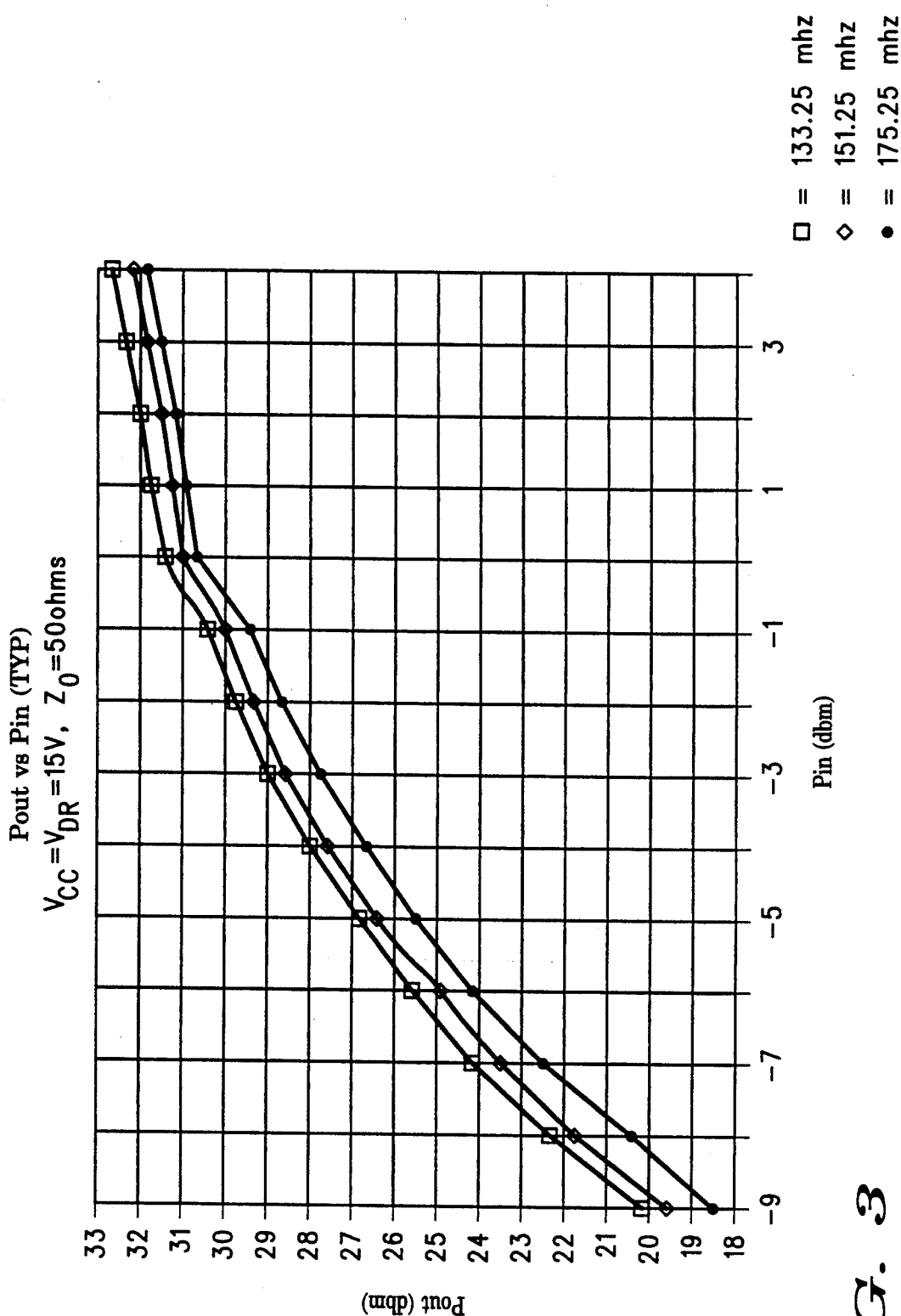
FIG. 3 is a graph illustrating the power input versus the power output of the circuit of FIG. 2.

The relation of the power input ($P_{in}$) to power output ($P_{out}$) as measured in dbm for a circuit embodying the present invention is illustrated in FIG. 3. The three lines on the graph of FIG. 3 relate to signals of 133.25 mhz, 151.25 mhz, and 175.25 mhz. At 1 watt, $P_{out}$ is approximately 30 dbm and $P_{in}$ ranges from approximately $-1.8$ dbm to $-3.0$ dbm.

Figure 4:
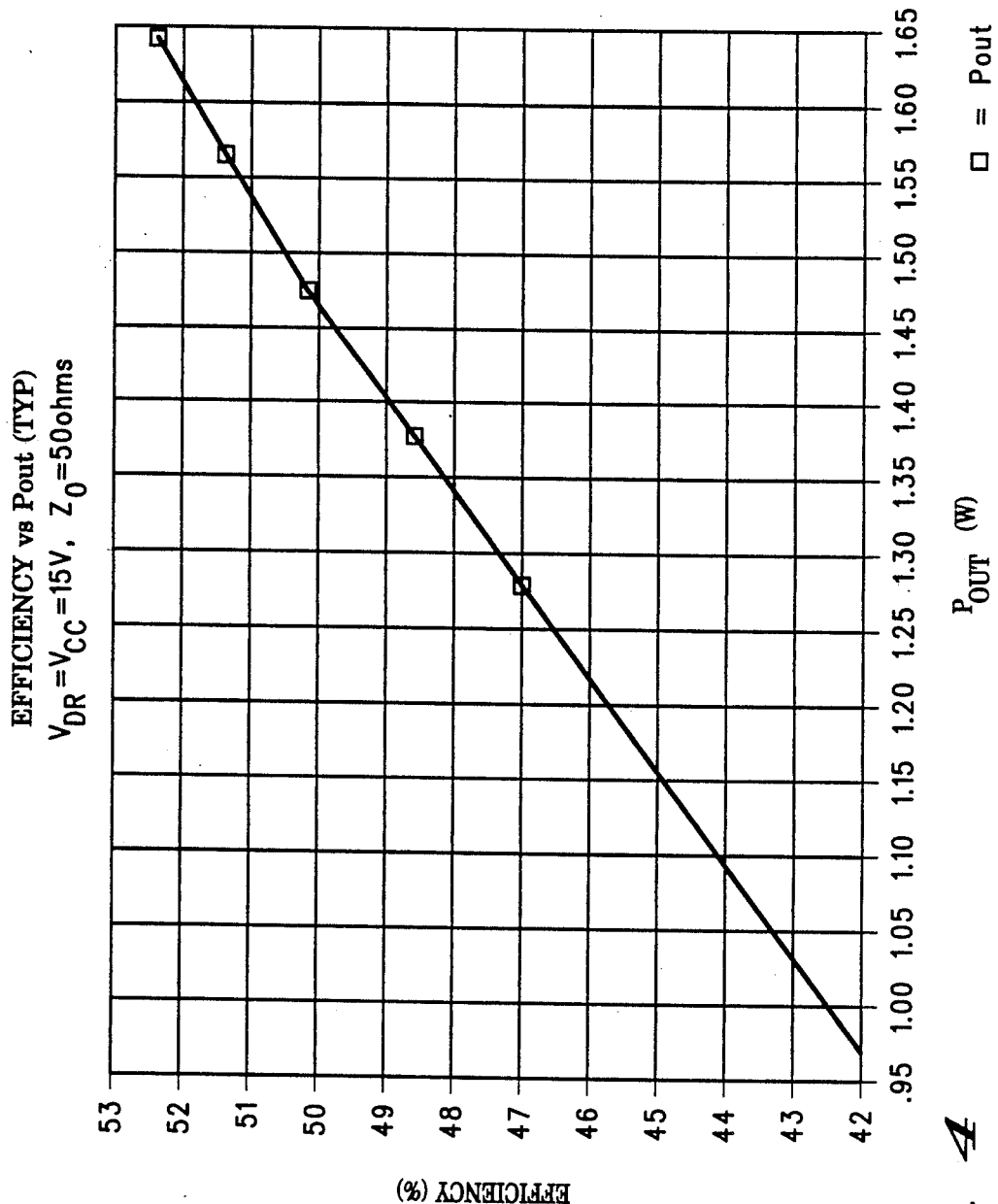
FIG. 4 is a graph illustrating the efficiency of the circuit of FIG. 2.

In FIG. 4, a graph of the efficiency versus the power output of a circuit embodying the present invention is illustrated. In the preferred operable range of 1 to 1.5 watts, the present circuit provides efficiencies in the range of approximately 42.5 to 50.5.

As described above, a device has been shown which accomplishes the objectives of providing the desired gain, harmonic rejection, and signal control desired. Further, the components utilized in this device are surface mount device, providing a more economical circuit.

Thus, it will be apparent to one skilled in the art that there has been provided in accordance with the invention, a method that fully satisfies the objects, aims, and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

I claim:

1. An amplifier having an input, output, and ground, said amplifier comprising:
   a first transistor having a base coupled to said input of said amplifier;
   degeneration means for limiting power dissipation in said first transistor, said degeneration means being coupled between a collector of said first transistor and a first supply voltage;
   first decoupling means for removing signals from said first supply voltage, said first decoupling means being coupled between said collector of said first transistor and said ground of said amplifier;
   a second transistor having a base coupled to said collector of said first transistor and a collector coupled to said output of said amplifier; and
   coupling means for matching impedance between said first and second transistors, said coupling means being coupled between said collector of said first transistor and a base of said second transistor.

2. The amplifier of claim 1 further comprising a second decoupling means for removing signals from a second supply voltage, said second decoupling means being coupled between said collector of said second transistor and said second supply voltage.

3. The amplifier of claim 2 wherein said second decoupling means comprises:
   a first inductor coupled between said second supply voltage and said collector of said second transistor; and
   a first capacitor coupled between said second supply voltage and said ground.

4. The amplifier of claim 1 further comprising a filter means for filtering an output signal, said filter means being coupled between said collector of said second transistor and said output of said amplifier.

5. The amplifier of claim 4 wherein said filter comprises:
   a band stop filter having an input coupled to said collector of said second transistor and an output; and a low pass filter having an input coupled to said output of said band stop filter and an output coupled to said output of said amplifier.

6. The amplifier of claim 1 wherein said first transistor is biased in a class A configuration.

7. The amplifier of claim 1 wherein said degeneration means comprises:
   a first resistor being coupled between said first supply voltage and said collector of said first transistor; and
   a second capacitor being coupled between said first supply voltage and said ground.

8. The amplifier of claim 1 wherein said first decoupling means comprises:
   a second inductor having a first lead coupled to said collector of said first transistor and a second lead; and
   a third capacitor having a first lead coupled to said second lead of said second inductor and a second lead coupled to ground.

9. The amplifier of claim 1 wherein said second transistor is biased in a class C configuration.

10. The amplifier of claim 1 wherein said coupling means comprises a transformer having a first lead of a first winding coupled to said collector of said first transistor, a first lead of a second winding coupled to said base of said second transistor, and a second lead of said first and second windings coupled to said ground.

11. The amplifier of claim 1 wherein said first supply voltage is a variable driver voltage.

12. An amplifier having an input, output, and ground, said amplifier comprising:
   a first transistor having a base coupled to said input of said amplifier and an emitter coupled to said ground;
   degeneration means for limiting power dissipation in said first transistor, said degeneration means being coupled between a collector of said first transistor and a first supply voltage;
   a transformer having a first lead of a first winding coupled to said collector of said first transistor and a first lead of a second winding coupled to ground;
   a first capacitor having a first lead coupled to a second lead of said first winding of said transformer and a second lead coupled to said ground; and
   a second transistor having a base coupled to a second lead of said second winding of said transformer, an emitter coupled to said ground, and a collector coupled to said output.

13. The amplifier of claim 12 further comprising a decoupling means for removing signals from a second supply voltage, said decoupling means being coupled between said collector of said second transistor and said second supply voltage.

14. The amplifier of claim 13 wherein said decoupling means comprises:
   a first inductor coupled between said second supply voltage and said collector of said second transistor; and
   a second capacitor coupled between said second supply voltage and said ground.

15. The amplifier of claim 12 further comprising a filter means for filtering an output signal, said filter means being coupled between said collector of said second transistor and said output of said amplifier.

16. The amplifier of claim 15 wherein said filter comprises:
   a band stop filter having an input coupled to said collector of said second transistor and an output; and
   a low pass filter having an input coupled to said output of said band stop filter and an output coupled to said output of said amplifier.

17. The amplifier of claim 12 wherein said first transistor is biased in a class A configuration.

18. The amplifier of claim 12 wherein said degeneration means comprises:
   a first resistor being coupled between said first supply voltage and said collector of said first transistor; and
   a third capacitor being coupled between said first supply voltage and said ground.

19. The amplifier of claim 12 wherein said second transistor is biased in a class C configuration.

20. The amplifier of claim 12 wherein said first supply voltage is a variable driver voltage.

* * * * *